United States Patent
Chin et al.

(10) Patent No.: US 12,316,338 B2
(45) Date of Patent: May 27, 2025

(54) HIGH-SPEED SUCCESSIVE-APPROXIMATION REGISTER ANALOG-TO-DIGITAL CONVERTER

(71) Applicant: MEDIATEK INC., Hsinchu (TW)

(72) Inventors: Pang-Yen Chin, Hsinchu (TW); Wei-Hsin Tseng, Hsinchu (TW); Kuan-Ta Chen, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 191 days.

(21) Appl. No.: 18/157,150

(22) Filed: Jan. 20, 2023

(65) Prior Publication Data

US 2023/0378971 A1 Nov. 23, 2023

Related U.S. Application Data

(60) Provisional application No. 63/343,580, filed on May 19, 2022.

(51) Int. Cl.
*H03M 1/46* (2006.01)

(52) U.S. Cl.
CPC .................. *H03M 1/46* (2013.01)

(58) Field of Classification Search
CPC ........ H03M 1/46; H03M 1/462; H03M 1/466; H03M 1/66; H03M 1/667
USPC .......... 341/155, 144, 163, 172, 161
See application file for complete search history.

(56) References Cited

U.S. PATENT DOCUMENTS

| | | | |
|---|---|---|---|
| 9,083,375 B1* | 7/2015 | Chang | H03M 1/125 |
| 9,490,832 B1 | 11/2016 | Zhou | |
| 2021/0409009 A1 | 12/2021 | Kang et al. | |

FOREIGN PATENT DOCUMENTS

| | | |
|---|---|---|
| CN | 104113341 A | 10/2014 |
| TW | I477082 B | 3/2015 |
| TW | I535219 B | 5/2016 |

OTHER PUBLICATIONS

Extended European Search Report dated Oct. 25, 2023, issued in application No. EP 23170417.2.
Luo, J., et al.; "A 0.9-V 12-Bit 100-MS/S 14.6-FJ/Conversion-Step SAR ADC in 40-NM CMOS;" IEEE Transactions on Very Large Scale Integration (VLSI) Systems; vol. 26; No. 10; Oct. 2018; pp. 1980-1988.
Lin, Y.-Z., et al.; "A 8.2-mW 10-b 1.6-GS/s 4x Ti SAR ADC with fast reference charge neutralization and background timing-skew calibration in 16-nm CMOS;" 2016 Symposium on VLSI Circuits Digest of Technical Papers; Jun. 2016; pp. 1-2.
Chinese language office action dated Mar. 15, 2024, issued in application No. TW 112114338.

* cited by examiner

*Primary Examiner* — Peguy Jean Pierre
(74) *Attorney, Agent, or Firm* — McClure, Qualey & Rodack, LLP

(57) ABSTRACT

A high-speed successive-approximation register analog-to-digital converter (SAR ADC) is shown. A digital-to-analog converter (DAC), a comparator, and a SAR logic circuit are configured to form a loop for successive approximation of a digital representation of an analog input. The SAR logic circuit includes a plurality of latches. Each latch uses a one-gate-delay circuit to wire the comparator to one bit-control terminal of the DAC.

22 Claims, 16 Drawing Sheets

US 12,316,338 B2

HIGH-SPEED SUCCESSIVE-APPROXIMATION REGISTER ANALOG-TO-DIGITAL CONVERTER

CROSS REFERENCE TO RELATED APPLICATIONS

This application claims the benefit of U.S. Provisional Application No. 63/343,580, filed May 19, 2022, the entirety of which is incorporated by reference herein.

BACKGROUND OF THE INVENTION

Field of the Invention

The present invention relates to successive-approximation register analog-to-digital converters (SAR ADCs).

Description of the Related Art

Successive-approximation register analog-to-digital converters (SAR ADCs) are widely used in electronic circuits. A SAR ADC uses a binary or non-binary search through all possible quantization levels for successive approximation of a digital representation of an analog input.

How to speed-up the successive approximation is an important issue in the SAR ADC field.

BRIEF SUMMARY OF THE INVENTION

High-speed successive-approximation register analog-to-digital converters (SAR ADCs) are shown.

In accordance with an exemplary embodiment of the present invention, a SAR ADC comprises a digital-to-analog converter (e.g., a capacitive digital-to-analog converter (CDAC) or a resistive digital-to-analog converter (RDAC)), a comparator, and a SAR logic circuit, which are configured to form a loop for successive approximation of a digital representation of an analog input. The SAR logic circuit includes a plurality of latches. Each latch uses a one-gate-delay circuit to wire the comparator to one bit-control terminal of the DAC.

In an exemplary embodiment, the one-gate-delay circuit includes a complex gate.

In an exemplary embodiment, the complex gate is an OR-AND-INVERTER (OAI) gate. A first input terminal and a second input terminal of the OAI gate are provided for an OR logic, and a third input terminal of the OAI gate is provided for a NAND logic. The first input terminal of the OAI gate is wired to a positive output terminal of the comparator. The second input terminal of the OAI gate is wired to a window control signal. A first output terminal of the latch is wired to the third input terminal of the OAI gate to form a latch structure. In an exemplary embodiment, each latch further has a NAND gate, the first output terminal of the latch is wired to a first input terminal of the NAND gate, and an output terminal of the NAND gate is wired to the third input terminal of the OAI gate. In an exemplary embodiment, each latch further has an inverter, having an input terminal wired to a reset control signal of the latch, and an output terminal wired to a second input terminal of the NAND gate.

In an exemplary embodiment, the OAI gate has a first PMOS and a second PMOS wired in series between a voltage source and the output terminal of the OAI gate. The voltage source is wired to the second PMOS through the first PMOS. The window control signal is wired to a gate terminal of the first PMOS. The positive output terminal of the comparator is wired to a gate terminal of the second PMOS.

In another exemplary embodiment, the complex gate is an AND-OR-INVERTER (AOI) gate. A first input terminal and a second input terminal of the AOI gate are provided for an AND logic, and a third input terminal of the AND-OR-INVERTER gate is provided for a NOR logic. The first input terminal of the AOI gate is wired to the positive output terminal of the comparator. The second input terminal of the AOI gate is wired to the window control signal. A first output terminal of the latch is wired to the third input terminal of the AOI gate to form a latch structure. In an exemplary embodiment, each latch further has a NOR gate, the first output terminal of the latch is wired to a first input terminal of the NOR gate, and an output terminal of the NOR gate is wired to the third input terminal of the AOI gate. In an exemplary embodiment, a reset control signal of each latch is wired to a second input terminal of the NOR gate.

In an exemplary embodiment, the AOI gate has a first NMOS and a second NMOS wired in series between the output terminal of the AOI gate and a ground terminal. The output terminal of the AOI gate is wired to the second NMOS through the first NMOS. The positive output terminal of the comparator is wired to a gate terminal of the first NMOS. The window control signal is wired to a gate terminal of the second NMOS.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
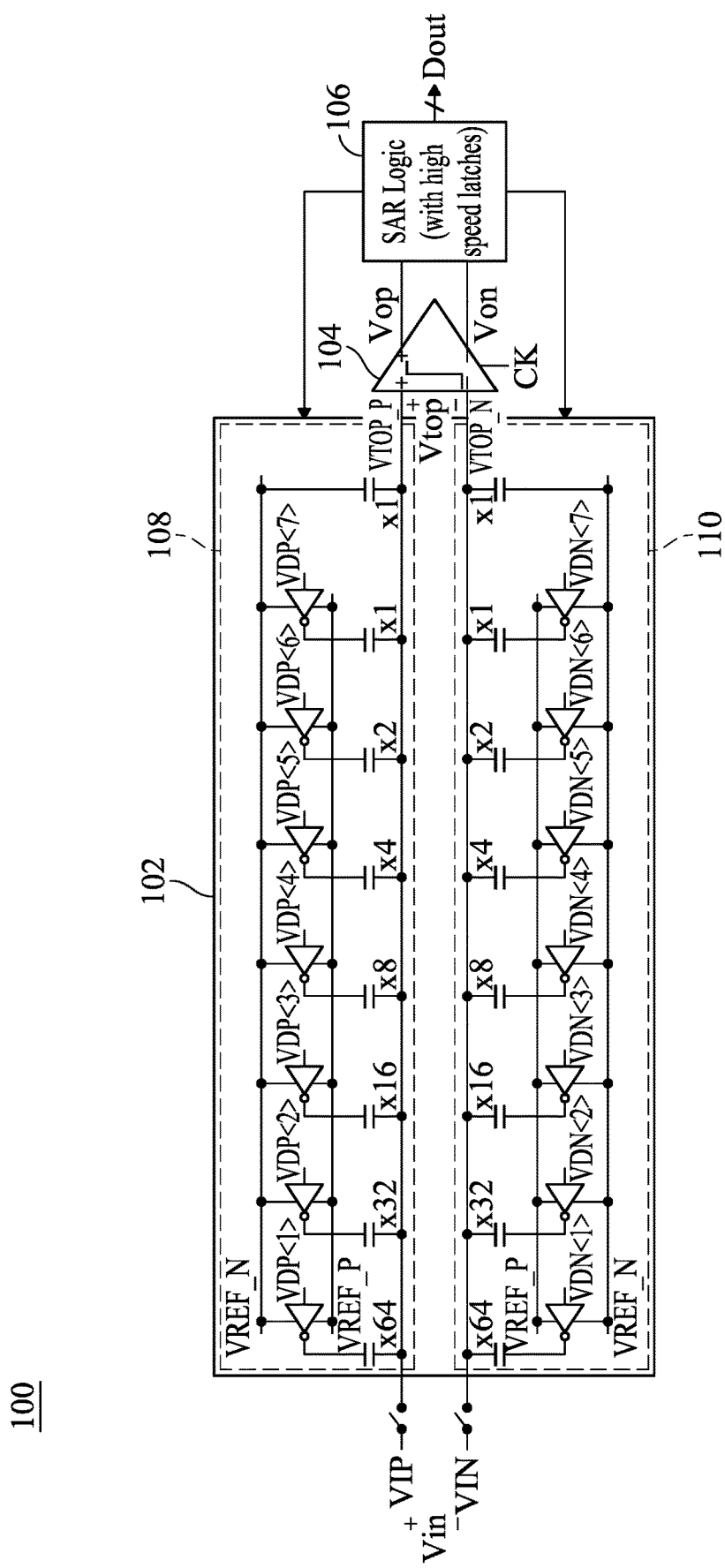
FIG. 1 illustrates successive-approximation register analog-to-digital converter (SAR ADC) 100 in accordance with an exemplary embodiment of the present invention.

FIG. 1 illustrates successive-approximation register analog-to-digital converter (SAR ADC) 100 in accordance with an exemplary embodiment of the present invention. The SAR ADC 100 includes a capacitive digital-to-analog converter (CDAC) 102 (or replaced by a resistive digital-to-analog converter (RDAC)), a comparator 104, and a successive-approximation register (SAR) logic circuit 106 (with high-speed latches), which are configured to form a loop for successive approximation of a digital representation Dout of an analog input Vin.

In this example, the CDAC 102 has a positive part 108 and a negative part 110. In the positive part 108, there are a plurality of positive-path capacitors and a plurality of positive-path drivers (driven by VDP<1> to VDP<7>) for approximation based on a differential positive part VIP of the analog input Vin. In the negative part 110, there are a plurality of negative-path capacitors and a plurality of negative-path drivers (driven by VDN<1> to VDN<7>) for approximation based on a differential negative part VIN of the analog input Vin. A residue signal Vtop is generated by the CDAC 102. A differential positive part VTOP_P and a differential negative part VTOP_N of the residue signal Vtop are compared by the comparator 104, and the comparator 104 has a positive output terminal Vop and a negative output terminal Von wired to each latch of the SAR logic circuit 106. The different latches of the SAR logic circuit 106 provide their latched values VDP<1>~VDP<7> and VDN<1>~VDN<7> to the CDAC 102 to perform a binary search (from ×64, to ×32, to ×16, to ×8, to ×4, to ×2, and finally to ×1 resolution) and, accordingly, the approximation of the digital representation Dout of the analog input Vin is obtained.

The present invention has a special design in the latches of the SAR logic circuit 106. Each latch uses a one-gate-delay circuit to wire the comparator 104 to one bit-control terminal (referring to one of VDP<1>~VDP<7>, or one of the VDN<1>~18 VDN<7>) of the CDAC 102.

In comparison with the conventional techniques which introduces two, or three or more gate delays between the comparator 104 and the CDAC 102, the SAR ADC 100 using a one-gate-delay circuit in each latch to limit the delay between the comparator 104 and the CDAC 102 is a high-speed SAR ADC design.

In the other exemplary embodiments, the CDAC 102 may be replaced by its variants. In FIG. 1, the CDAC 102 using inverters as the drivers is a step-down CDAC. In some other exemplary embodiments, the drivers may be replaced by buffers, and a step-up CDAC is provided.

Figure 2:
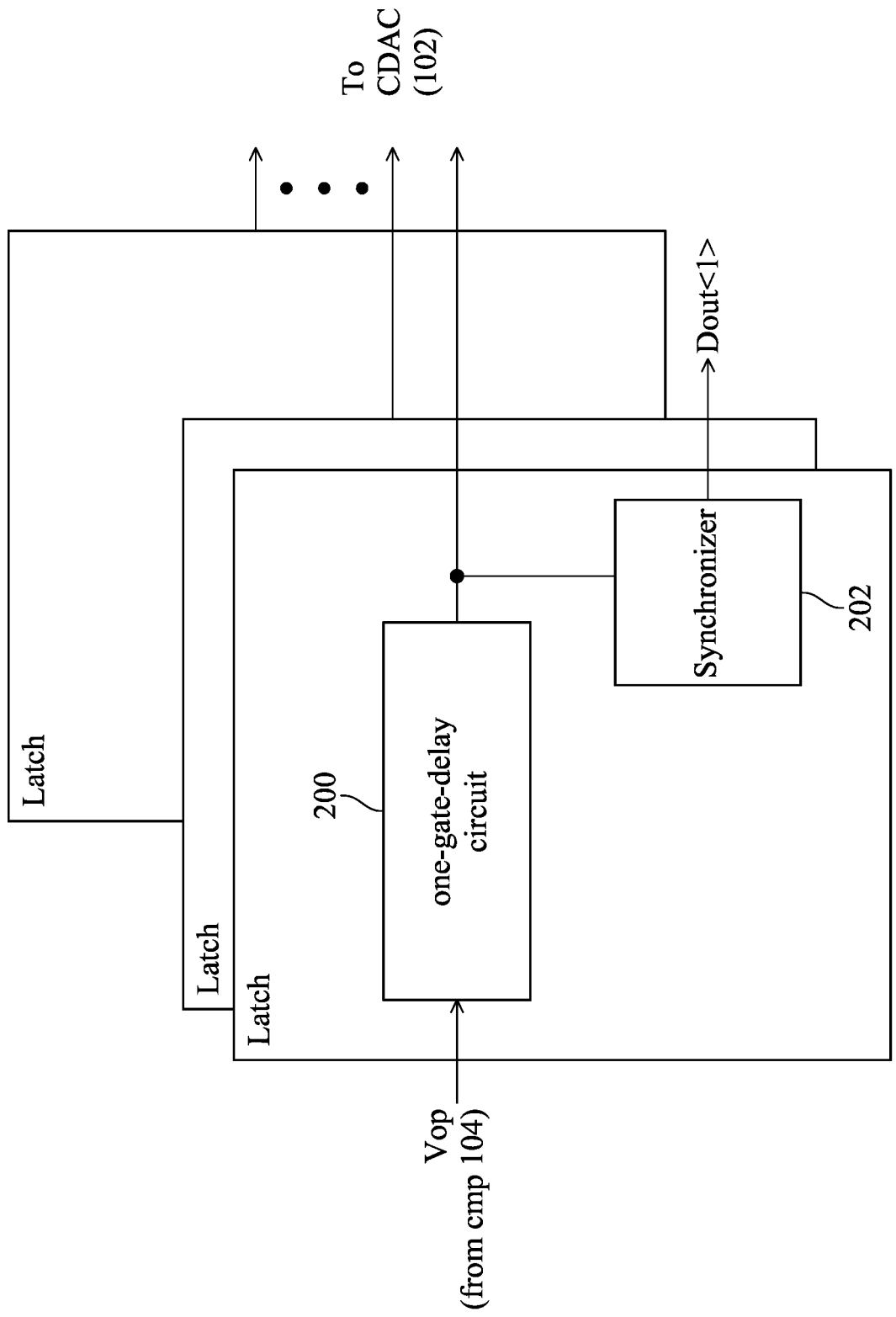
FIG. 2 depicts the latches of the SAR logic circuit 106 in accordance with an exemplary embodiment of the present invention.

FIG. 2 depicts the latches of the SAR logic circuit 106 in accordance with an exemplary embodiment of the present invention. Each latch uses a one-gate-delay circuit 200 to wire a positive output terminal of the comparator 104 to the CDAC 102 (to provide one of VDP<1>~VDP<7>, or one of the VDN<1>~VDN<7>). The output of the one-gate-delay circuit 200 can be further wired to a synchronizer 202 (e.g. a D flip-flop) to generate one bit of the digital representation Dout. The one-gate-delay circuit 200 may be a complex gate, such as an OR-AND-INVERTER (OAI) gate, or an AND-OR-INVERTER (AOI) gate.

Figure 3A:
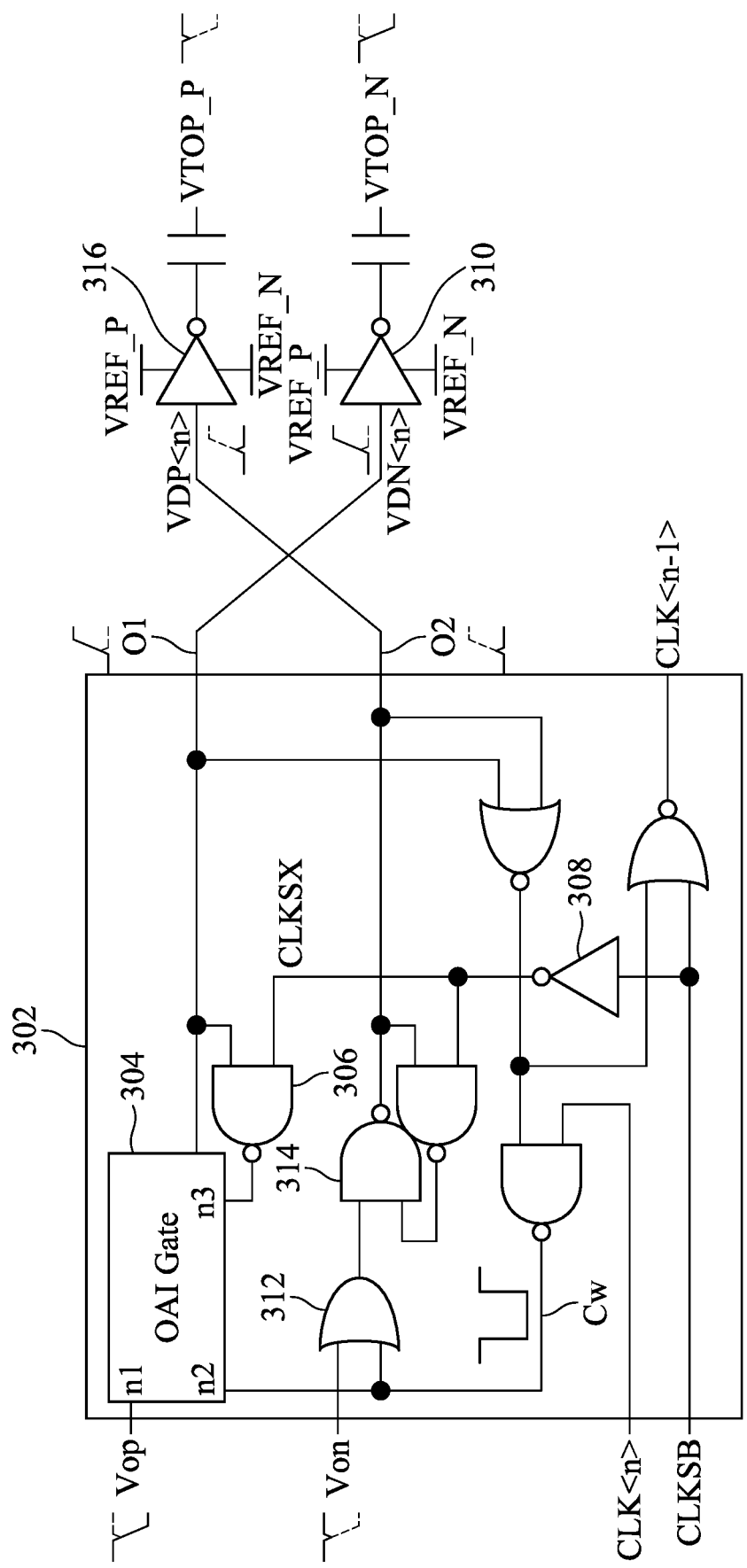
FIG. 3A depicts a latch 302 using an OAI gate 304 to wire the positive output terminal Vop of the comparator 104 to a corresponding bit-control terminal of a step-down CDAC (e.g. CDAC 302 that uses inverters as drivers)

FIG. 3A depicts a latch 302 using an OAI gate 304 to wire the positive output terminal Vop of the comparator 104 to a corresponding bit-control terminal of a step-down CDAC (e.g. CDAC 302 that uses inverters as drivers).

As shown, the OAI gate 304 provides three input terminals n1, n2 and n3. The input terminals n1 and n2 are provided for an OR logic. The input terminal n3 is provided for a NAND logic. The input terminal n1 is wired to the positive output terminal Vop of the comparator 104. The input terminal n2 is wired to a window control signal Cw. An output terminal O1 of the latch 302 is further wired to the input terminal n3 of the OAI gate 304 (e.g., through a logic gate) to form a latch structure.

In the example, the latch 302 further has a NAND gate 306 and an inverter 308. The output terminal O1 of the latch 302 is wired to one input terminal of the NAND gate 306. A reset control signal CLKSB of the latch 302 is inverted by the inverter 308 as CLKSX and then wired to another input terminal of the NAND gate 306. An output terminal of the NAND gate 306 is wired to the input terminal n3 of the OAI gate 304.

According to the window control signal Cw, a latched status related to the voltage level at the positive output terminal Vop of the comparator 104 is presented at the output terminal O1. The output terminal O1 is wired to a corresponding negative-path driver 310 of the CDAC to provide the latched status as the signal VDN<n>. Accordingly, the voltage level VTOP_N at the top plate of the negative-path capacitors is controlled to reduce the residue voltage Vtop.

Referring to the waveforms shown in FIG. 3A, it shows that as Vop goes low, by the latch structure formed by the OAI gate 304 and the NAND gate 306, the output terminal O1 of OAI gate 304 is latched at a high level to drive the corresponding negative-path driver 310 and thereby pulls down the voltage level VTOP_N at the top plate of the negative-path capacitors. The residue voltage Vtop is successfully suppressed.

As shown, the latch 302 further has another latch structure, by which a latched status related to the voltage level at the negative output terminal Von of the comparator 104 is presented at an output terminal O2 of the latch 302. The OR gate 312 and the NAND gate 314 may be a two-gate-delay circuit, a three-gate-delay circuit, or another one-gate-delay circuit similar to the OAI gate 304. The output terminal O2 is wired to a corresponding positive-path driver 316 of the CDAC to provide the latched status as the signal VDP<n>. Accordingly, the voltage level VTOP_P at the top plate of the positive-path capacitors is controlled to reduce the residue voltage Vtop.

Figure 3B:
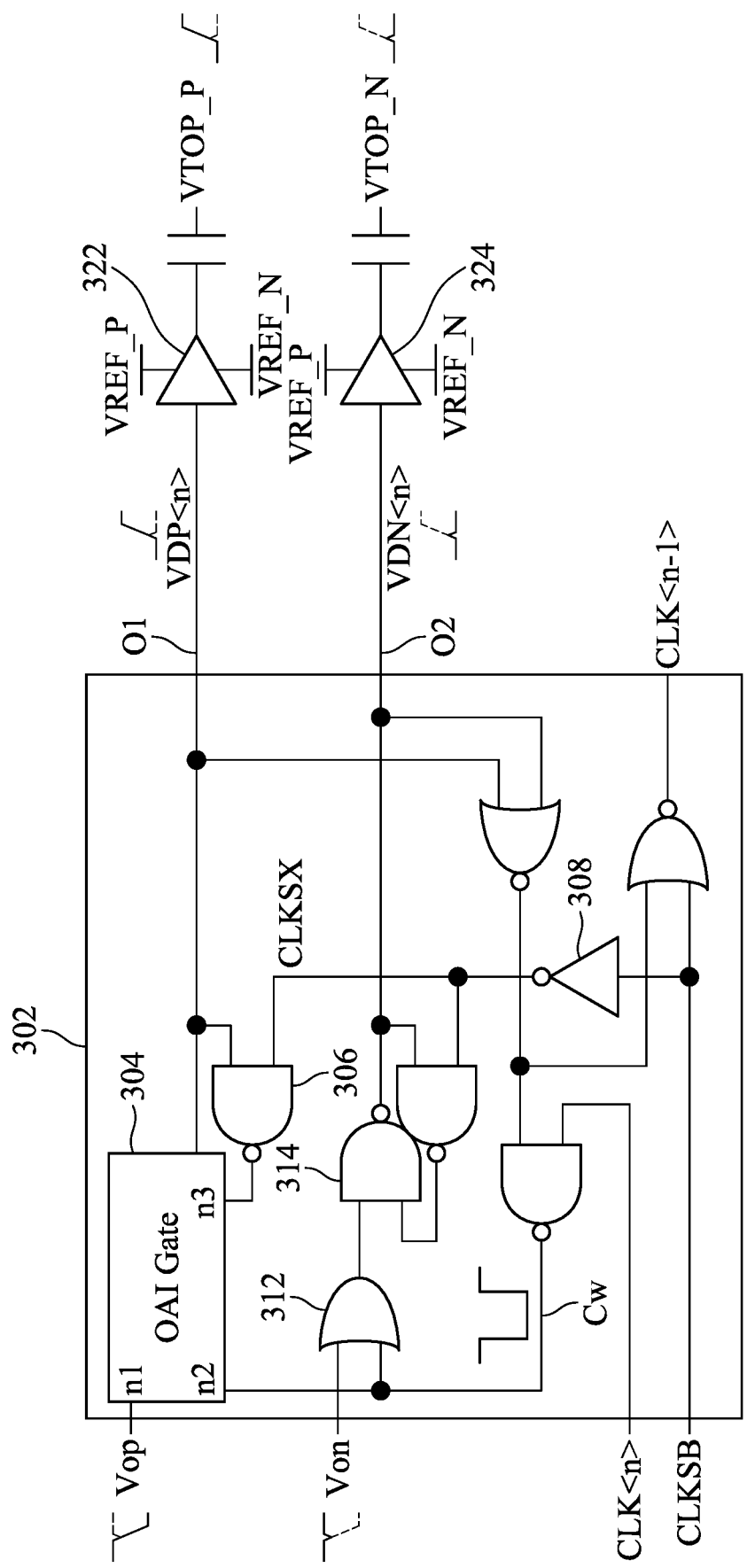
FIG. 3B depicts that the latch 302 using the OAI gate 304 wires the positive output terminal Vop of the comparator 104 to a corresponding bit-control terminal of a step-up CDAC (using buffers as the drivers)

FIG. 3B depicts that the latch 302 using the OAI gate 304 wires the positive output terminal Vop of the comparator 104 to a corresponding bit-control terminal of a step-up CDAC (using buffers as the drivers). In this example, the output terminal O1 is wired to a corresponding positive-path driver 322 of the CDAC to provide the latched status as the signal VDP<n>. Accordingly, the voltage level VTOP_P at the top plate of the positive-path capacitors is controlled to reduce the residue voltage Vtop.

Referring to the waveforms shown in FIG. 3B, the high-to-low Vop is discussed again. The high voltage latched at the output terminal O1 drives the corresponding positive-path driver 322 and thereby pulls up the voltage level VTOP_P at the top plate of the positive-path capacitors. The differential positive part is raised. The residue voltage Vtop is successfully suppressed.

In the example of FIG. 3B, the output terminal O2 is wired to a corresponding negative-path driver 324 of the CDAC to provide the latched status as the signal VDN<n>. Accordingly, the voltage level VTOP_N at the top plate of the negative-path capacitors is controlled to reduce the residue voltage Vtop.

Figure 4:
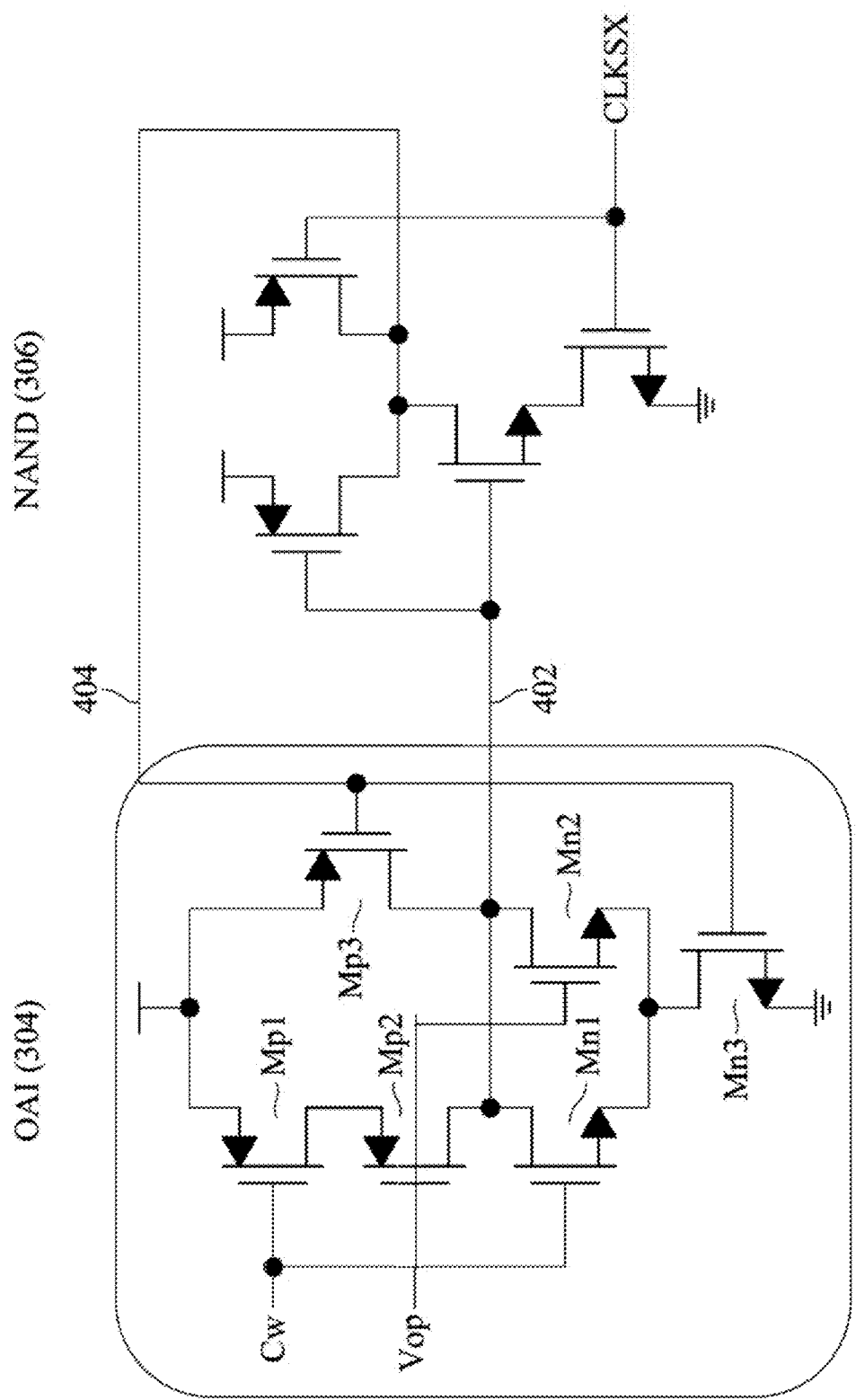
FIG. 4 shows the details of the OAI gate 304 in accordance with an exemplary embodiment of the present invention.

FIG. 4 shows the details of the OAI gate 304 in accordance with an exemplary embodiment of the present invention. The OAI gate 304 has three PMOSs (Mp1, Mp2, and Mp3) and three NMOSs (Mn1, Mn2, and Mn3). The PMOSs Mp1 and Mp2 are wired in series between a voltage source and the output terminal 402 of the OAI gate 304. One gate terminal of Mp1 or Mp2 is wired to the positive output terminal Vop of the comparator 104 while another gate terminal of the Mp1 or Mp2 is wired to the window control signal Cw. The NMOS Mn1 and Mn2 are wired in parallel between the output terminal 402 of the OAI gate 304 and a ground terminal. One gate terminal of Mn1 or Mn2 is wired to the positive output terminal Vop of the comparator 104 while another gate terminal of Mn1 and Mn2 is wired to the window control signal Cw. The PMOS Mp3 is wired between the voltage source and the output terminal 402 of the OAI gate 304, and has a gate terminal wired to the output terminal 404 of the NAND gate 306. The NMOSs Mn1 and Mn2 are wired to the ground terminal through the NMOS Mn3. The NMOS Mn3 has a gate terminal wired to the output terminal 404 of the NAND gate 306.

Specifically, FIG. 4 shows that the gate terminal of the PMOS Mp1 is wired to the window control signal Cw, and the gate terminal of the PMOS Mp2 is wired to the positive output terminal Vop of the comparator 104. The change at the positive output terminal Vop of the comparator 104 is quickly reflected at the output terminal 402 of the OAI gate 304.

In another exemplary embodiment, the gate terminal of the PMOS Mp1 is wired to the positive output terminal Vop of the comparator 104, and the gate terminal of the PMOS Mp2 is wired to the window control signal Cw.

In another exemplary embodiment, the output terminal 402 of the OAI gate 304 is first wired to the NMOS Mn3 and then is wired to the ground terminal through the parallel-connected NMOSs Mn1 and Mn2.

Figure 5A:
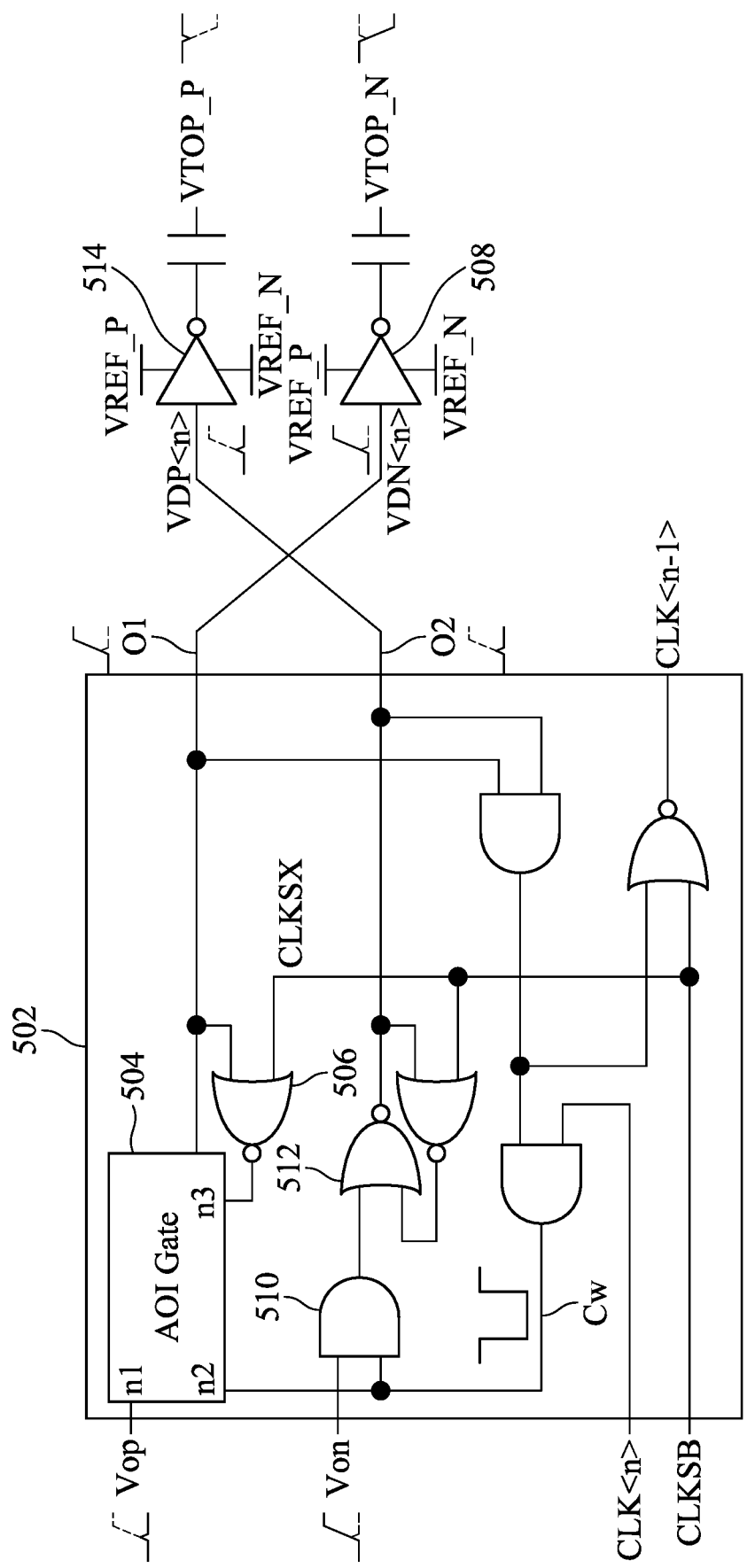
FIG. 5A depicts a latch 502 using an AOI gate 504 to wire the positive output terminal Vop of the comparator 104 to a corresponding bit-control terminal of a step-down CDAC (e.g. CDAC 302 that uses inverters as drivers)

FIG. 5A depicts a latch 502 using an AOI gate 504 to wire the positive output terminal Vop of the comparator 104 to a corresponding bit-control terminal of a step-down CDAC (e.g. CDAC 302 that uses inverters as drivers).

As shown, the AOI gate 504 provides three input terminals n1, n2 and n3. The input terminals n1 and n2 are provided for an AND logic. The input terminal n3 is provided for a NOR logic. The input terminal n1 is wired to the positive output terminal Vop of the comparator 104. The input terminal n2 is wired to a window control signal Cw. An output terminal O1 of the latch 502 is further wired to the input terminal n3 of the AOI gate 504 (e.g., through a logic gate) to form a latch structure.

In the example, the latch 502 further has a NOR gate 506. The output terminal O1 of the latch 502 is wired to one input terminal of the NOR gate 506. A reset control signal CLKSB of the latch 502 is wired to another input terminal of the NOR gate 506. An output terminal of the NOR gate 506 is wired to the input terminal n3 of the AOI gate 504.

According to the window control signal Cw, a latched status related to the voltage level at the positive output terminal Vop of the comparator 104 is presented at the output terminal O1. The output terminal O1 is wired to a corresponding negative-path driver 508 of the CDAC to provide the latched status as the signal VDN<n>. Accordingly, the voltage level VTOP_N at the top plate of the negative-path capacitors is controlled to reduce the residue voltage Vtop.

Referring to the waveforms shown in FIG. 5A, it shows that as Vop is low, by the latch structure formed by the AOI gate 504 and the NOR gate 506, the output terminal of AOI gate O1 is latched at a high level to drive the corresponding negative-path driver 508 and thereby pulls down the voltage level VTOP_N at the top plate of the negative-path capacitors. The residue voltage Vtop is successfully suppressed.

As shown, the latch 502 further has another latch structure, by which a latched status related to the voltage level at the negative output terminal Von of the comparator 104 is presented at an output terminal O2 of the latch 502. The AND gate 510 and the NOR gate 512 may be a two-gate-delay circuit, a three-gate-delay circuit, or another one-gate-delay circuit similar to the AOI gate 504. The output terminal O2 is wired to a corresponding positive-path driver 514 of the CDAC to provide the latched status as the signal VDP<n>. Accordingly, the voltage level VTOP_P at the top plate of the positive-path capacitors is controlled to reduce the residue voltage Vtop.

Figure 5B:
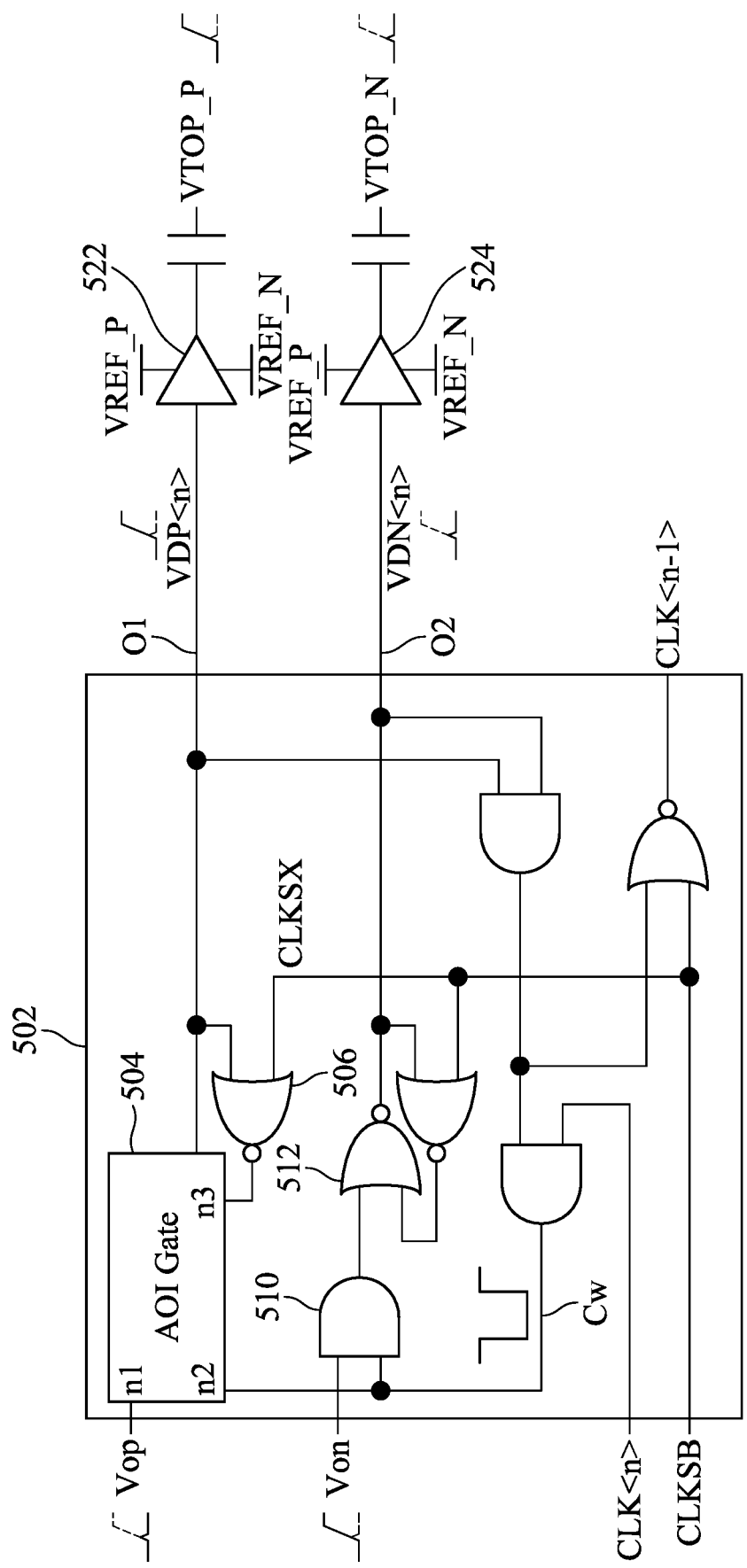
FIG. 5B depicts that the latch 502 using the AOI gate 504 wires the positive output terminal Vop of the comparator 104 to a corresponding bit-control terminal of a step-up CDAC (using buffers as the drivers)

FIG. 5B depicts that the latch 502 using the AOI gate 504 wires the positive output terminal Vop of the comparator 104 to a corresponding bit-control terminal of a step-up CDAC (using buffers as the drivers). In this example, the output terminal O1 is wired to a corresponding positive-path driver 522 of the CDAC to provide the latched status as the signal VDP<n>. Accordingly, the voltage level VTOP_P at the top plate of the positive-path capacitors is controlled to reduce the residue voltage Vtop.

Referring to the waveforms shown in FIG. 5B, the low Vop is discussed again. The high voltage latched at the output terminal O1 drives the corresponding positive-path driver 522 and thereby pulls up the voltage level VTOP_P at the top plate of the positive-path capacitors. The differential positive part is raised. The residue voltage Vtop is successfully suppressed.

In the example of FIG. 5B, the output terminal O2 is wired to a corresponding negative-path driver 524 of the CDAC to provide the latched status as the signal VDN<n>. Accordingly, the voltage level VTOP_N at the top plate of the negative-path capacitors is controlled to reduce the residue voltage Vtop.

Figure 6:
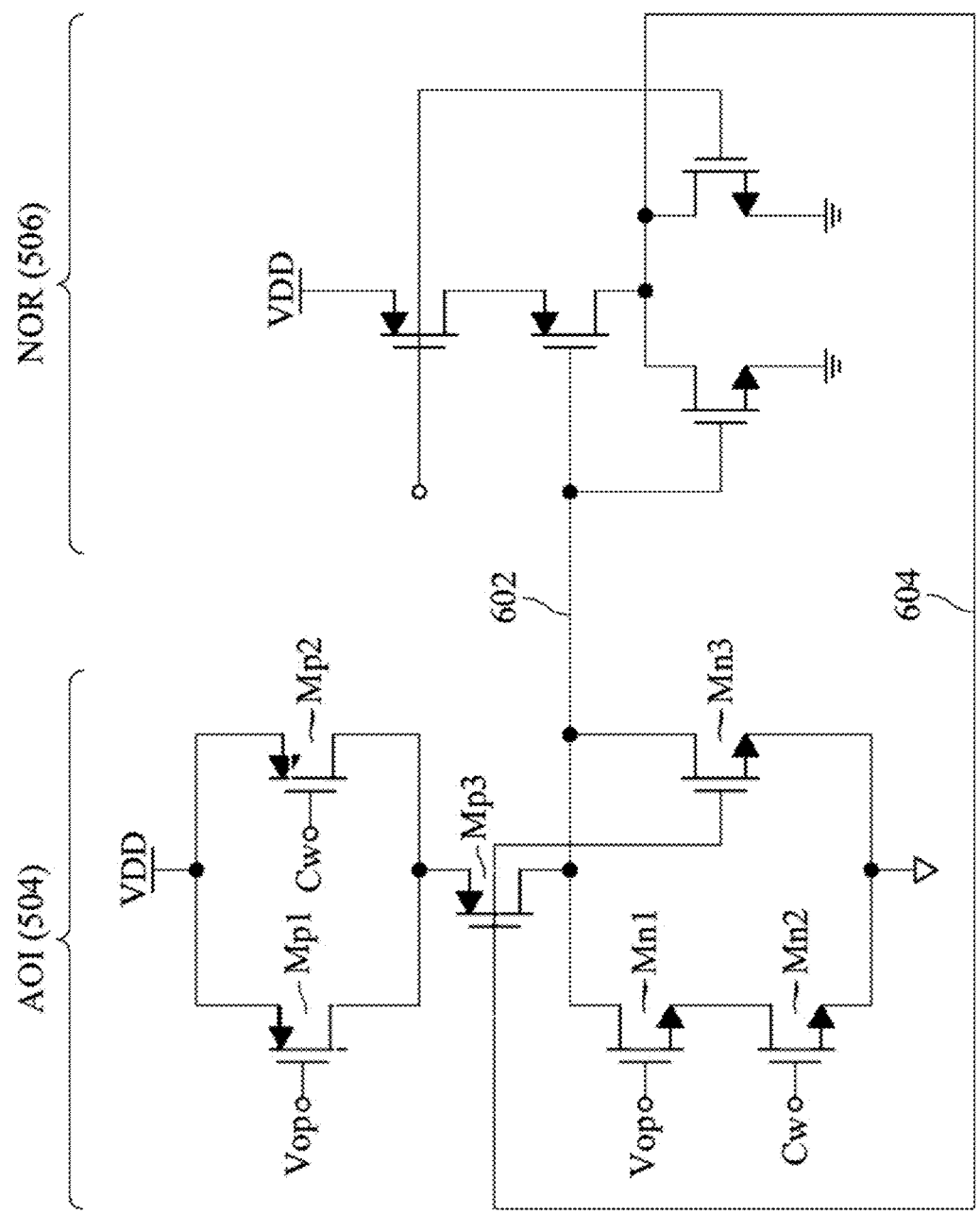
FIG. 6 shows the details of the AOI gate 504 in accordance with an exemplary embodiment of the present invention.

FIG. 6 shows the details of the AOI gate 504 in accordance with an exemplary embodiment of the present invention. The AOI gate 504 has three PMOSs (Mp1, Mp2, and Mp3) and three NMOSs (Mn1, Mn2, and Mn3). The PMOSs Mp1 and Mp2 are wired in parallel between a voltage source and the output terminal 602 of the AOI gate 504, and one gate terminal of Mp1 or Mp2 is wired to the positive output terminal Vop of the comparator 104 while another gate terminal oft Mp1 or Mp2 is wired to the window control signal Cw. The NMOSs Mn1 and Mn2 are wired in series between the output terminal 602 of the AOI gate 504 and a ground terminal, and one gate terminal of Mn1 and Mn2 is wired to the positive output terminal Vop of the comparator 104 while another gate terminal of Mn1 and Mn2 is wired to the window control signal Cw. The PMOSs Mp1 and Mp2 are wired to the output terminal 602 of the AOI gate 504 through the PMOS Mp3. The PMOS Mp3 has a gate terminal wired to the output terminal 604 of the NOR gate 506. The NMOS Mn3 is wired between the output terminal 602 of the AOI gate 504 and the ground terminal. The NMOS Mn3 has a gate terminal wired to the output terminal 604 of the NOR gate 506.

Specifically, FIG. 6 shows that the gate terminal of the NMOS Mn1 is wired to the positive output terminal Vop of the comparator 104, and the gate terminal of the NMOS Mn2 is wired to the window control signal Cw. The change at the positive output terminal Vop of the comparator 104 is quickly reflected at the output terminal 602 of the AOI gate 504.

In another exemplary embodiment, the gate terminal of the NMOS Mn1 is wired to the window control signal Cw, and the gate terminal of the NMOS Mn2 is wired to the positive output terminal Vop of the comparator 104.

In another exemplary embodiment, the voltage source VDD is first wired to the PMOS Mp3 and then wired to the output terminal 602 of the AOI gate 504 through the parallel-connected PMOSs Mp1 and Mp2.

Any SAR ADC with a SAR logic circuit with the proposed latches (using a one-gate-delay circuit to wire at least one comparator output to the CDAC) should be regarded as within the scope of the present invention.

The generation circuit of the window control signal Cw may be replaced by any pulse window generator.

The waveforms shown in FIGS. 3A, 3B, 5A, and 5B may have the other variations, depending on the comparator reset status (reset by high or low) and the CDAC switch reset status (reset by high or low).

Figure 7A:
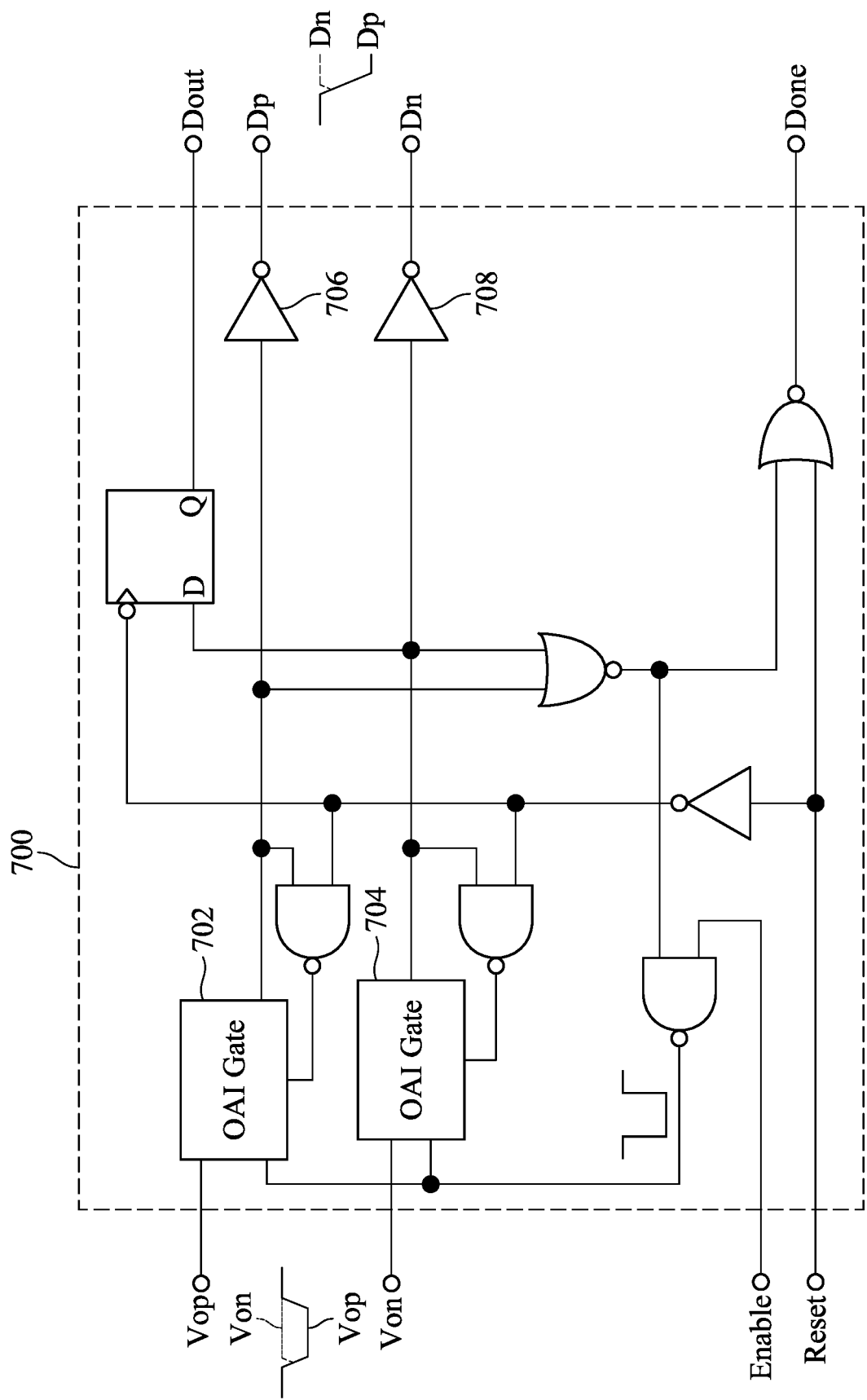
FIG. 7A depicts a latch 700 with a combination of designs 1 and 3, which uses OAI gates and includes two inverters 706 and 708.
Figure 7B:
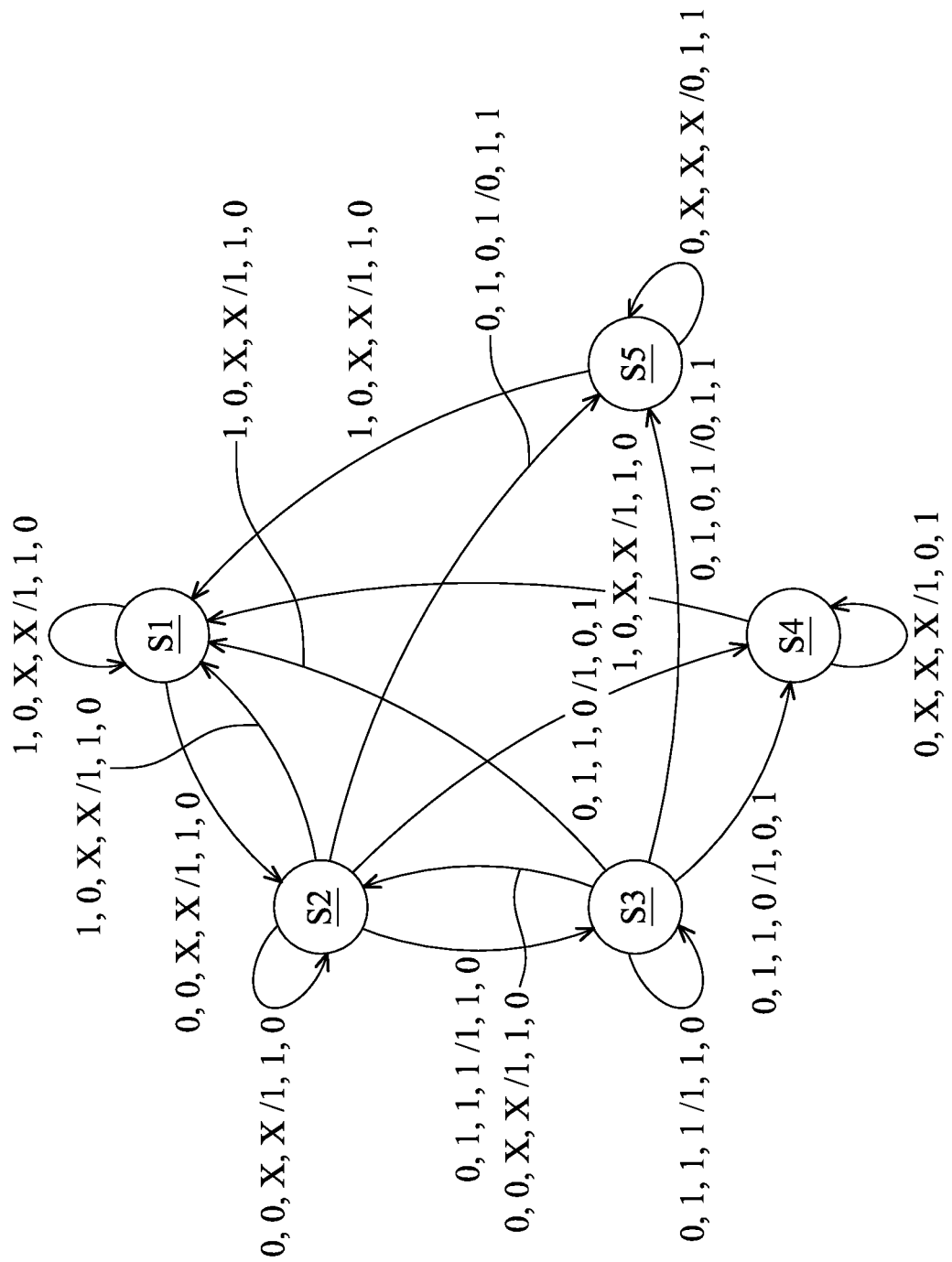
FIG. 7B depicts a state diagram of the latch 700 depicted in FIG. 7A.

The proposed latch has different configurations according to the reset level of the comparator 104 as well as the switching scheme of the DAC (102). There are four reset design:

Design 1: Comparator reset: HIGH
Design 2: Comparator reset: Low
Design 3: DAC switch reset: HIGH
Design 4: DAC switch reset: Low FIG. 7A depicts a latch 700 with a combination of designs 1 and 3, which uses OAI gates (702 and 704) and includes two inverters 706 and 708. FIG. 7B depicts a state diagram of the latch 700 depicted in FIG. 7A, changing between states S1 (reset and sync latched data), S2 (rest), S3 (ready for data), S4 (latch data high), and S5 (latch data low). The switching condition is: [Reset, Enable, Vop, Von/Dp, Dn, Done]. Table 1 is the state table of the latch 700.

TABLE 1

| Present State | Input | | | | Next State | Output | | | |
|---|---|---|---|---|---|---|---|---|---|
| State | Reset | Enable | Vop | Von | State | Dp | Dn | Done | Dout(t) |
| S1~S5 | 1 | 0 | X | X | S1 | 1 | 1 | 0 | Dp(t) |
| S1~S3 | 0 | 0 | X | X | S2 | 1 | 1 | 1 | Dout(t) |

TABLE 1-continued

| Present State | Input | | | | Next State | Output | | | |
|---|---|---|---|---|---|---|---|---|---|
| State | Reset | Enable | Vop | Von | State | Dp | Dn | Done | Dout(t) |
| S2, S3 | 0 | 1 | 1 | 1 | S3 | 1 | 1 | 0 | Dout(t) |
| S2, S3 | 0 | 1 | 1 | 0 | S4 | 1 | 0 | 1 | Dout(t) |
| S2, S3 | 0 | 1 | 0 | 1 | S5 | 0 | 1 | 1 | Dout(t) |

Figure 8A:
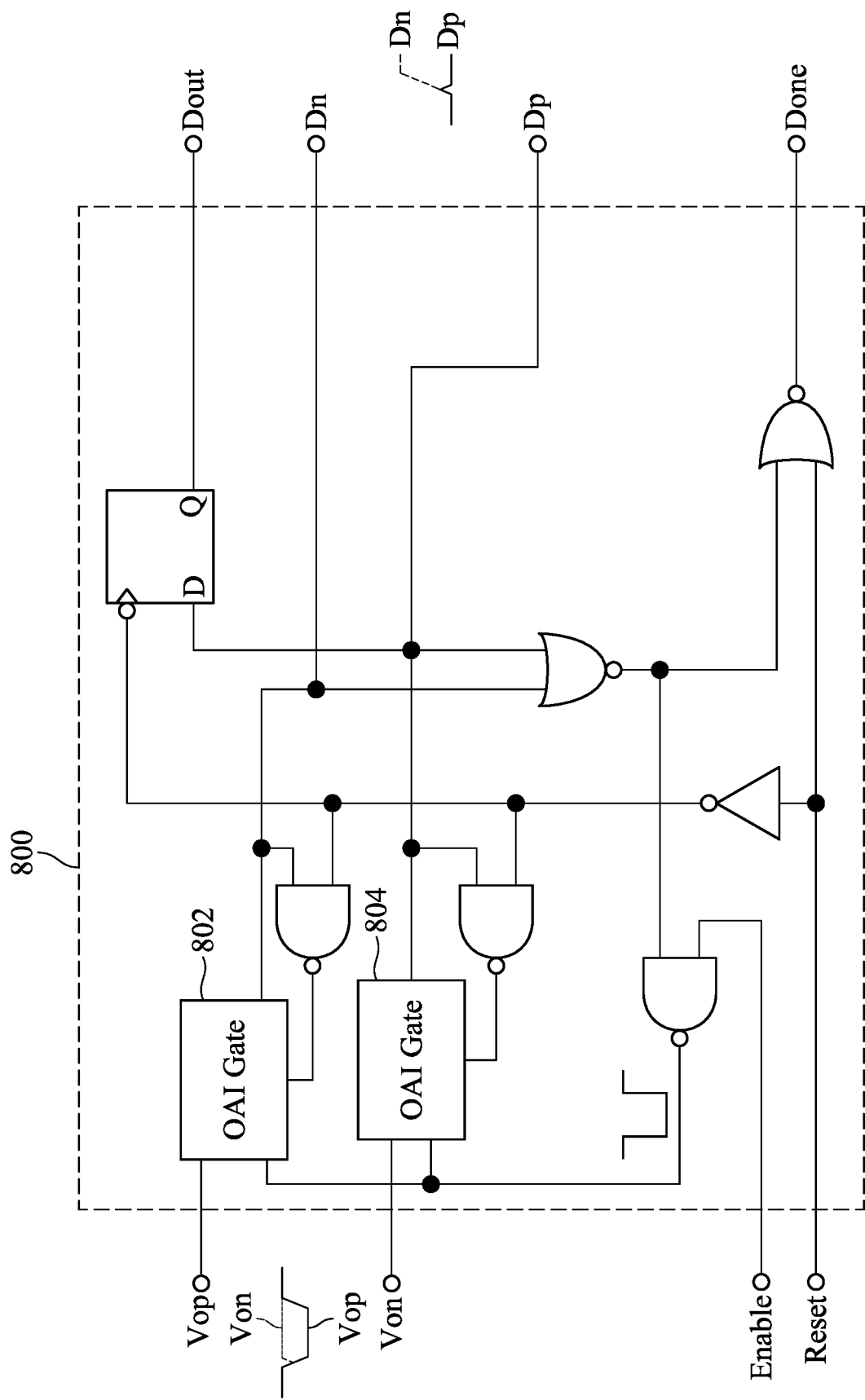
FIG. 8A depicts a latch 800 with a combination of designs 1 and 4, which uses OAI gates.
Figure 8B:
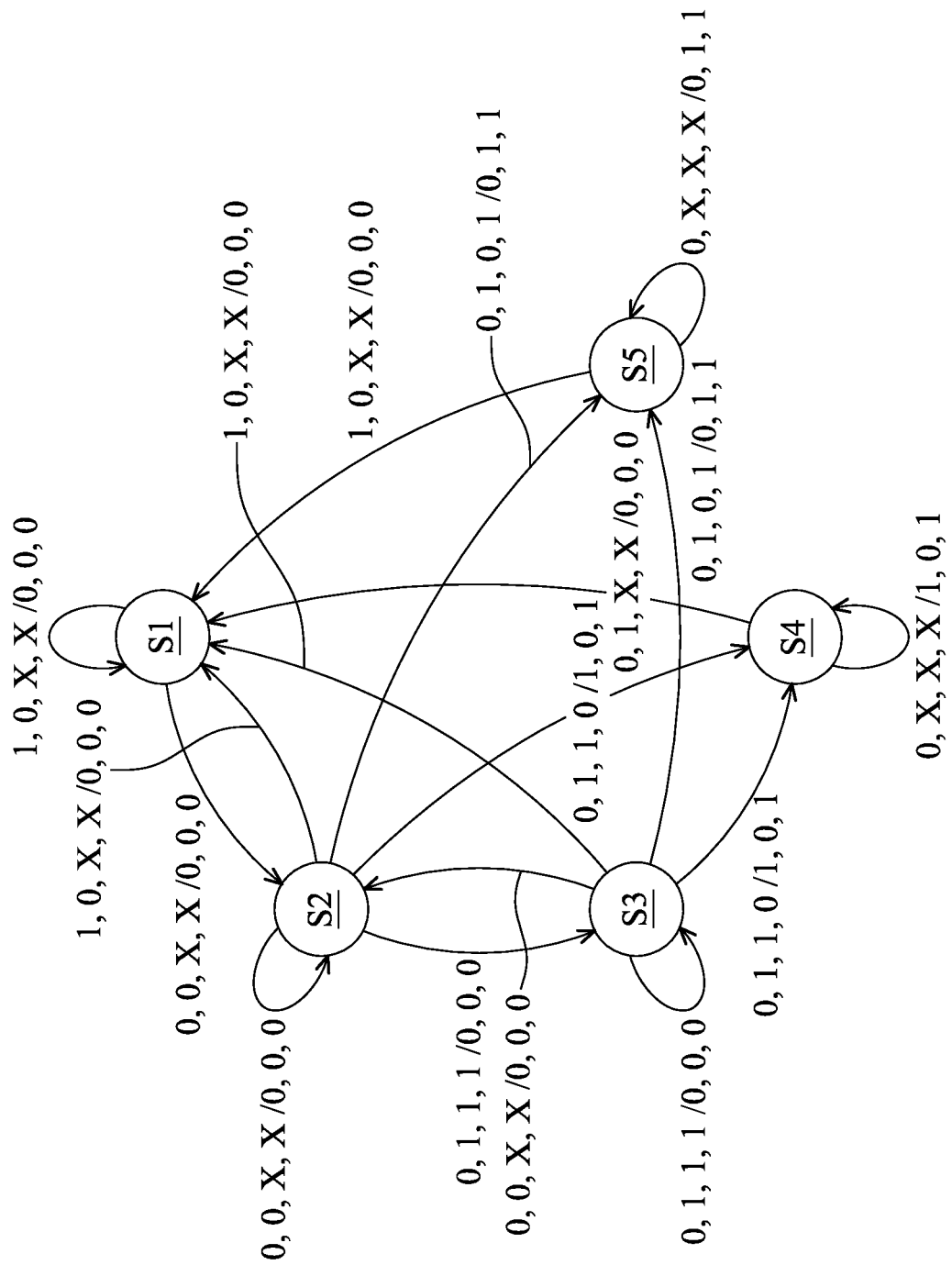
FIG. 8B depicts a state diagram of the latch 800 depicted in FIG. 8A.

FIG. 8A depicts a latch 800 with a combination of designs 1 and 4, which uses OAI gates 802 and 804. FIG. 8B depicts a state diagram of the latch 800 depicted in FIG. 8A, changing between states S1 (reset and sync latched data), S2 (rest), S3 (ready for data), S4 (latch data high), and S5 (latch data low). The switching condition is: [Reset, Enable, Vop, Von/Dp, Dn, Done]. Table 2 is the state table of the latch 800.

TABLE 2

| Present State | Input | | | | Next State | Output | | | |
|---|---|---|---|---|---|---|---|---|---|
| State | Reset | Enable | Vop | Von | State | Dp | Dn | Done | Dout(t) |
| S1~S5 | 1 | 0 | X | X | S1 | 0 | 0 | 0 | Dp(t) |
| S1~S3 | 0 | 0 | X | X | S2 | 0 | 0 | 0 | Dout(t) |
| S2, S3 | 0 | 1 | 1 | 1 | S3 | 0 | 0 | 0 | Dout(t) |
| S2, S3 | 0 | 1 | 1 | 0 | S4 | 1 | 0 | 1 | Dout(t) |
| S2, S3 | 0 | 1 | 0 | 1 | S5 | 0 | 1 | 1 | Dout(t) |

Figure 9A:
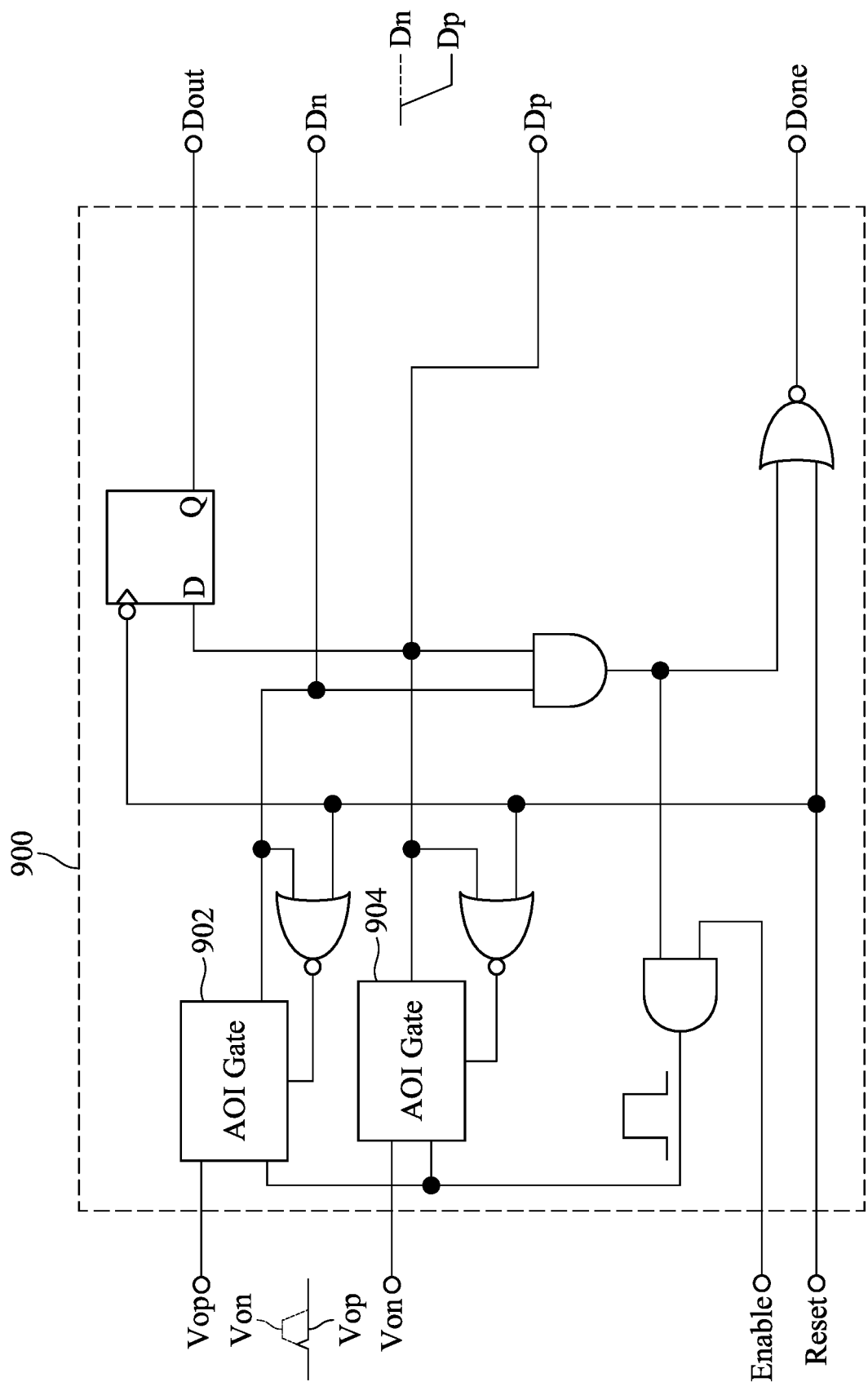
FIG. 9A depicts a latch 900 with a combination of designs 2 and 3, which uses AOI gates.
Figure 9B:
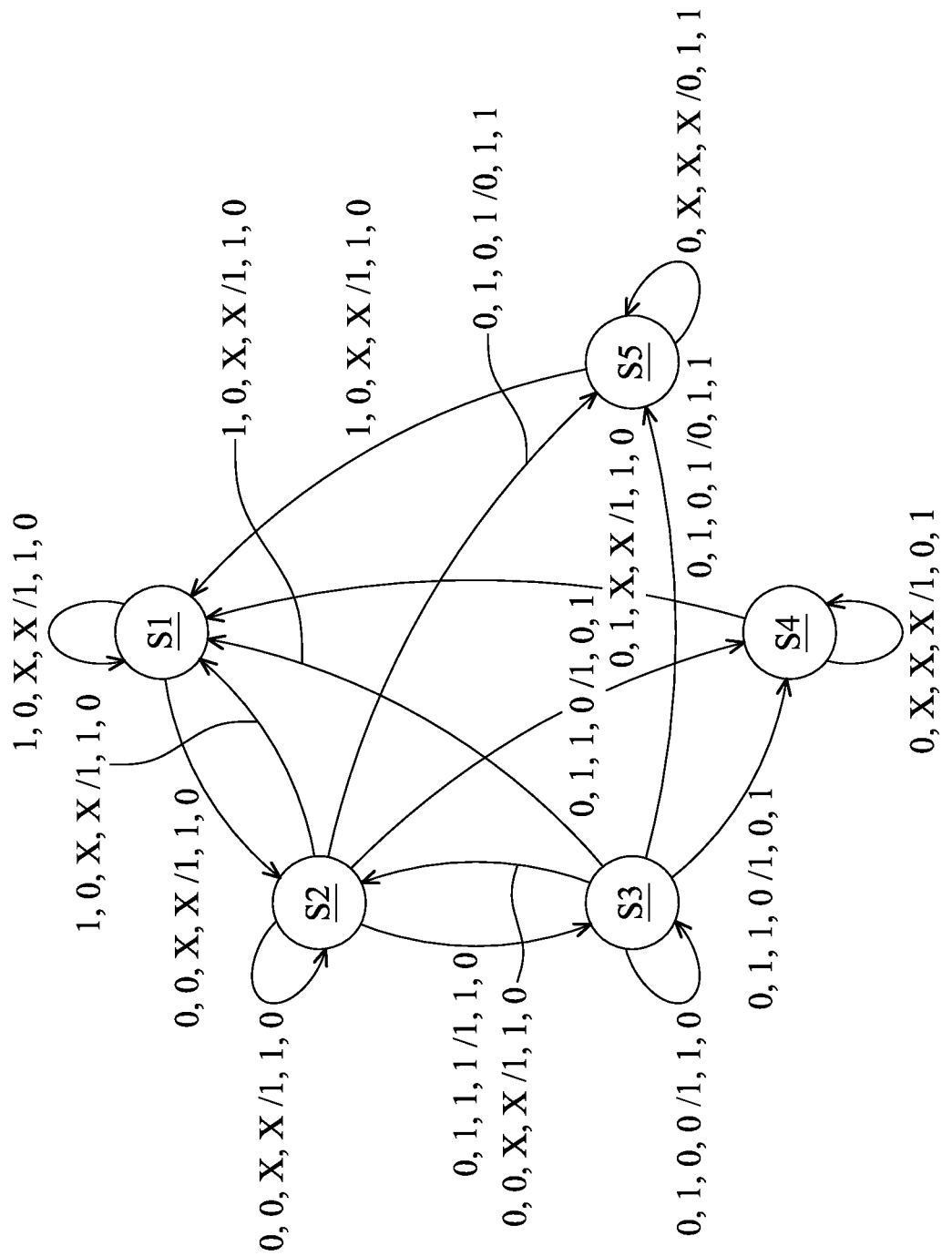
FIG. 9B depicts a state diagram of the latch 900 depicted in FIG. 9A.

FIG. 9A depicts a latch 900 with a combination of designs 2 and 3, which uses AOI gates 902 and 904. FIG. 9B depicts a state diagram of the latch 900 depicted in FIG. 9A, changing between states S1 (reset and sync latched data), S2 (rest), S3 (ready for data), S4 (latch data high), and S5 (latch data low). The switching condition is: [Reset, Enable, Vop, Von/Dp, Dn, Done]. Table 3 is the state table of the latch 900.

TABLE 3

| Present State | Input | | | | Next State | Output | | | |
|---|---|---|---|---|---|---|---|---|---|
| State | Reset | Enable | Vop | Von | State | Dp | Dn | Done | Dout(t) |
| S1~S5 | 1 | 0 | X | X | S1 | 1 | 1 | 0 | Dp(t) |
| S1~S3 | 0 | 0 | X | X | S2 | 1 | 1 | 0 | Dout(t) |
| S2, S3 | 0 | 1 | 1 | 1 | S3 | 1 | 1 | 0 | Dout(t) |
| S2, S3 | 0 | 1 | 1 | 0 | S4 | 1 | 0 | 1 | Dout(t) |
| S2, S3 | 0 | 1 | 0 | 1 | S5 | 0 | 1 | 1 | Dout(t) |

Figure 10A:
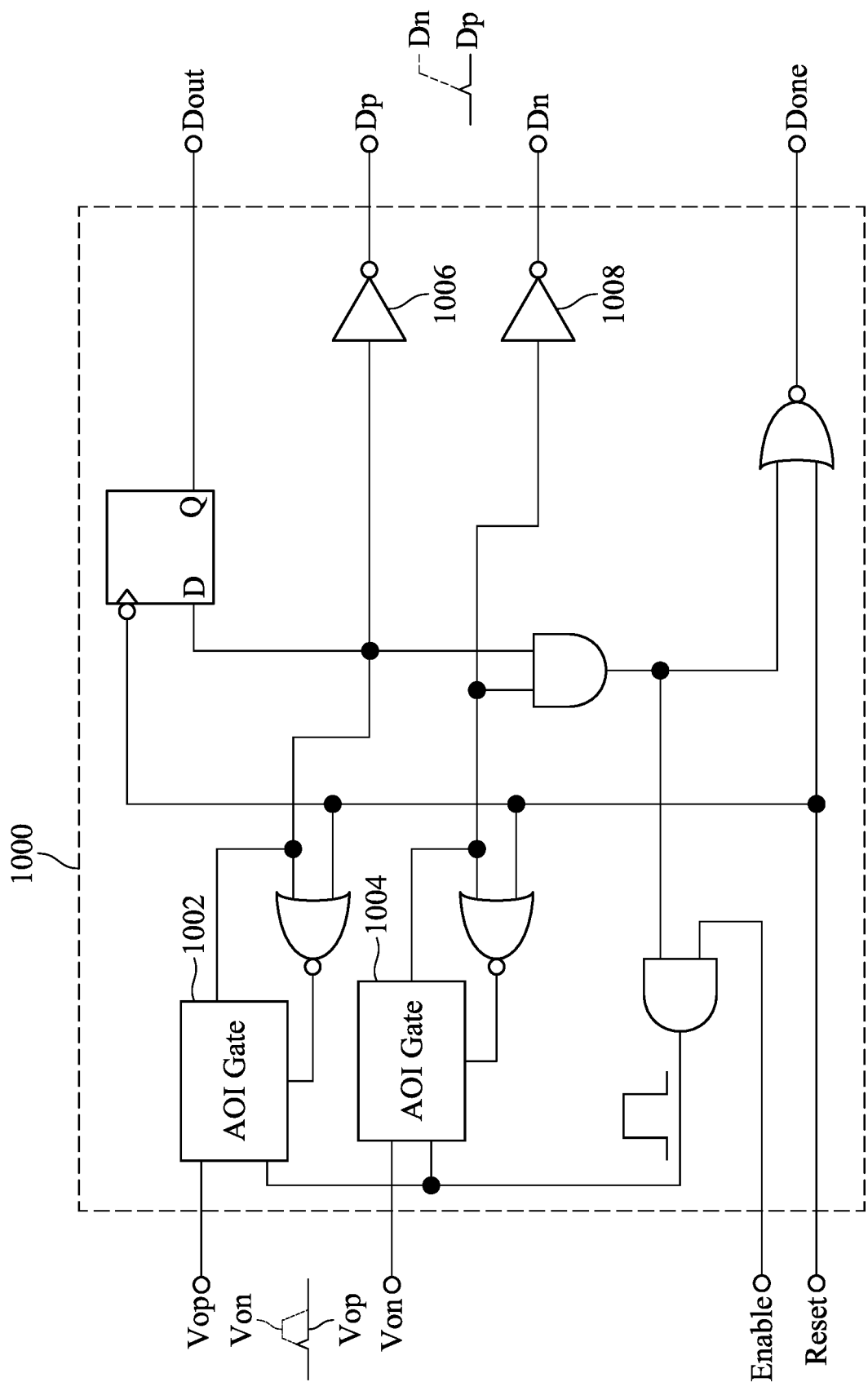
FIG. 10A depicts a latch 1000 with a combination of designs 2 and 4, which uses AOI gates and inverters 1006 and 1008.
Figure 10B:
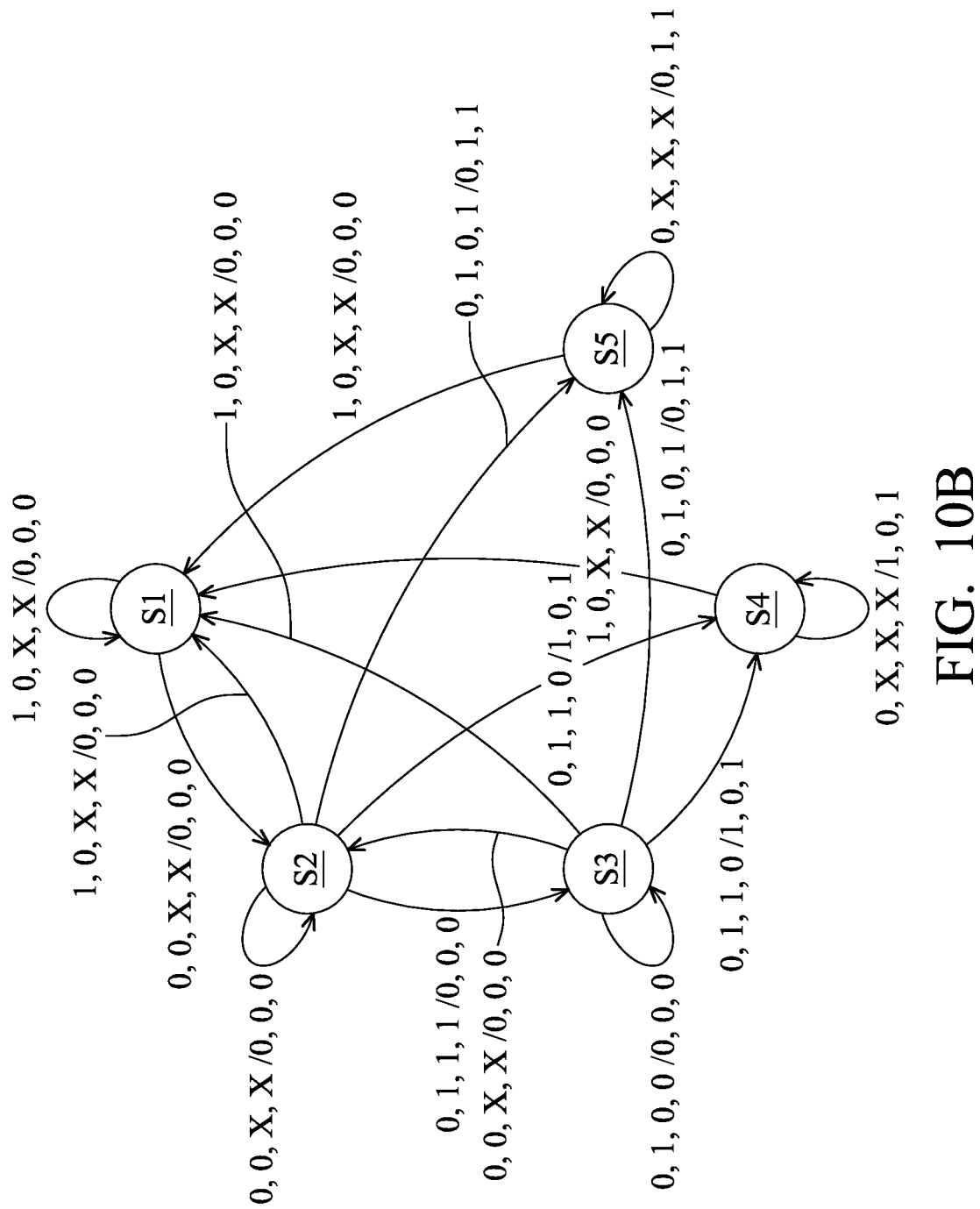
FIG. 10B depicts a state diagram of the latch 1000 depicted in FIG. 10A.

FIG. 10A depicts a latch 1000 with a combination of designs 2 and 4, which uses AOI gates (1002 and 1004) and inverters 1006 and 1008. FIG. 10B depicts a state diagram of the latch 1000 depicted in FIG. 10A, changing between states S1 (reset and sync latched data), S2 (rest), S3 (ready for data), S4 (latch data high), and S5 (latch data low). The switching condition is: [Reset, Enable, Vop, Von/Dp, Dn, Done]. Table 4 is the state table of the latch 1000.

TABLE 4

| Present State | Input | | | | Next State | Output | | | |
|---|---|---|---|---|---|---|---|---|---|
| State | Reset | Enable | Vop | Von | State | Dp | Dn | Done | Dout(t) |
| S1~S5 | 1 | 0 | X | X | S1 | 0 | 0 | 0 | Dp(t) |
| S1~S3 | 0 | 0 | X | X | S2 | 0 | 0 | 0 | Dout(t) |
| S2, S3 | 0 | 1 | 0 | 0 | S3 | 0 | 0 | 0 | Dout(t) |
| S2, S3 | 0 | 1 | 1 | 0 | S4 | 1 | 0 | 1 | Dout(t) |
| S2, S3 | 0 | 1 | 0 | 1 | S5 | 0 | 1 | 1 | Dout(t) |

Any latch using OAI/AIO gate(s) and operates according to any of the state diagrams (FIGS. 7B, 8B, 9B, and 10B) should be considered within the scope of the present invention.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A successive-approximation register analog-to-digital converter, comprising:
    a digital-to-analog converter, a comparator, and a successive-approximation register logic circuit, configured to form a loop for successive approximation of a digital representation of an analog input,
    wherein:
    the successive-approximation register logic circuit includes a plurality of latches; and
    each latch uses a one-gate-delay circuit to wire the comparator to one bit-control terminal of the digital-to-analog converter.

2. The successive-approximation register analog-to-digital converter as claimed in claim 1, wherein:
    the one-gate-delay circuit includes a complex gate.

3. The successive-approximation register analog-to-digital converter as claimed in claim 2, wherein:
    the complex gate is an OR-AND-INVERTER gate;
    a first input terminal and a second input terminal of the OR-AND-INVERTER gate are provided for an OR logic, and a third input terminal of the OR-AND-INVERTER gate is provided for a NAND logic;
    the first input terminal of the OR-AND-INVERTER gate is wired to a positive output terminal of the comparator;
    the second input terminal of the OR-AND-INVERTER gate is wired to a window control signal; and
    a first output terminal of the latch is wired to the third input terminal of the OR-AND-INVERTER gate to form a latch structure.

4. The successive-approximation register analog-to-digital converter as claimed in claim 3, wherein:
    each latch further has a NAND gate, the first output terminal of the latch is wired to a first input terminal of the NAND gate, and an output terminal of the NAND gate is wired to the third input terminal of the OR-AND-INVERTER gate.

5. The successive-approximation register analog-to-digital converter as claimed in claim 4, wherein:
    each latch further has an inverter, having an input terminal wired to a reset control signal of the latch, and an output terminal wired to a second input terminal of the NAND gate.

6. The successive-approximation register analog-to-digital converter as claimed in claim 5, wherein the digital-to-analog converter comprises:
    a plurality of positive-path capacitors and a plurality of positive-path drivers for approximation based on a differential positive part of the analog input, generating a differential positive part of a residue signal;
    a plurality of negative-path capacitors and a plurality of negative-path drivers for approximation based on a differential negative part of the analog input, generating a differential negative part of the residue signal,
    wherein the differential positive part and the differential negative part of the residue signal are compared by the comparator, and the comparator further has a negative output terminal wired to each latch.

7. The successive-approximation register analog-to-digital converter as claimed in claim 6, wherein:
    the positive-path drivers and the negative-path drivers are inverters;
    the first output terminal of each latch is wired to a corresponding negative-path driver;
    each latch further has a second output terminal presenting a latched status corresponding to the negative output terminal of the comparator; and
    the second output terminal of each latch is wired to a corresponding positive-path driver.

8. The successive-approximation register analog-to-digital converter as claimed in claim 6, wherein:
    the positive-path drivers and the negative-path drivers are buffers; and
    the first output terminal of each latch is wired to a corresponding positive-path driver;
    each latch further has a second output terminal presenting a latched status corresponding to the negative output terminal of the comparator; and
    the second output terminal of each latch is wired to a corresponding negative-path driver.

9. The successive-approximation register analog-to-digital converter as claimed in claim 4, wherein:
    the OR-AND-INVERTER gate has a first PMOS, a second PMOS, a first NMOS, and a second NMOS;
    the first PMOS and the second PMOS are wired in series between a voltage source and the output terminal of the OR-AND-INVERTER gate, and one gate terminal of the first PMOS or the second PMOS is wired to the positive output terminal of the comparator while another gate terminal of the first PMOS and the second PMOS is wired the window control signal;
    the first NMOS and the second NMOS are wired in parallel between the output terminal of the OR-AND-INVERTER gate and a ground terminal, and one gate terminal of the first NMOS or the second NMOS is wired to the positive output terminal of the comparator while another gate terminal of the first NMOS and the second NMOS is wired to the window control signal;
    the OR-AND-INVERTER gate further has a third PMOS and a third NMOS;
    the third PMOS is wired between the voltage source and the output terminal of the OR-AND-INVERTER gate, and has a gate terminal wired to the output terminal of the NAND gate; and between the output terminal of the OR-AND-INVERTER gate and the ground terminal, the third NMOS is wired in series with the parallel-connected first and second NMOSs, and the third NMOS has a gate terminal wired to the output terminal of the NAND gate.

10. The successive-approximation register analog-to-digital converter as claimed in claim 9, wherein:
the first PMOS has a source terminal wired to the voltage source, and the gate terminal of the first PMOS is wired to the window control signal;
the second PMOS has a source terminal wired to a drain terminal of the first PMOS, and a drain terminal wired to the output terminal of the OR-AND-INVERTER gate, and the gate terminal of the second PMOS is wired to the positive output terminal of the comparator.

11. The successive-approximation register analog-to-digital converter as claimed in claim 2, wherein:
the complex gate is an AND-OR-INVERTER gate;
a first input terminal and a second input terminal of the AND-OR-INVERTER gate are provided for an AND logic, and a third input terminal of the AND-OR-INVERTER gate is provided for a NOR logic;
the first input terminal of the AND-OR-INVERTER gate is wired to a positive output terminal of the comparator;
the second input terminal of the AND-OR-INVERTER gate is wired to a window control signal; and
a first output terminal of the latch is wired to the third input terminal of the AND-OR-INVERTER gate to form a latch structure.

12. The successive-approximation register analog-to-digital converter as claimed in claim 11, wherein:
each latch further has a NOR gate, the first output terminal of the latch is wired to a first input terminal of the NOR gate, and an output terminal of the NOR gate is wired to the third input terminal of the AND-OR-INVERTER gate.

13. The successive-approximation register analog-to-digital converter as claimed in claim 12, wherein:
a reset control signal of each latch is wired to a second input terminal of the NOR gate.

14. The successive-approximation register analog-to-digital converter as claimed in claim 13, wherein the digital-to-analog converter comprises:
a plurality of positive-path capacitors and a plurality of positive-path drivers for approximation based on a differential positive part of the analog input, generating a differential positive part of a residue signal;
a plurality of negative-path capacitors and a plurality of negative-path drivers for approximation based on a differential negative part of the analog input, generating a differential negative part of the residue signal,
wherein the differential positive part and the differential negative part of the residue signal are compared by the comparator, and the comparator further has a negative output terminal wired to each latch.

15. The successive-approximation register analog-to-digital converter as claimed in claim 14, wherein:
the positive-path drivers and the negative-path drivers are inverters; and
the first output terminal of each latch is wired to a corresponding negative-path driver;
each latch further has a second output terminal presenting a latched status corresponding to the negative output terminal of the comparator; and
the second output terminal of each latch is wired to a corresponding positive-path driver.

16. The successive-approximation register analog-to-digital converter as claimed in claim 14, wherein:
the positive-path drivers and the negative-path drivers are buffers; and
the first output terminal of each latch is wired to a corresponding positive-path driver;
each latch further has a second output terminal presenting a latched status corresponding to the negative output terminal of the comparator; and
the second output terminal of each latch is wired to a corresponding negative-path driver.

17. The successive-approximation register analog-to-digital converter as claimed in claim 12, wherein:
the AND-OR-INVERTER gate has a first PMOS, a second PMOS, a first NMOS, and a second NMOS;
the first PMOS and the second PMOS are wired in parallel between a voltage source and the output terminal of the AND-OR-INVERTER gate, and one gate terminal of the first PMOS or the second PMOS is wired to the positive output terminal of the comparator while another gate terminal of the first PMOS and the second PMOS is wired to the window control signal;
the first NMOS and the second NMOS are wired in series between the output terminal of the AND-OR-INVERTER gate and a ground terminal, and one gate terminal of the first NMOS or the second NMOS is wired to the positive output terminal of the comparator while another gate terminal of the first NMOS and the second NMOS is wired to the window control signal;
the AND-OR-INVERTER gate further has a third PMOS and a third NMOS;
between the voltage source and the output terminal of the AND-OR-INVERTER gate, the third PMOS is wired in series with the parallel-connected first and the second PMOSs, and the third PMOS has a gate terminal wired to the output terminal of the NOR gate; and
the third NMOS is wired between the output terminal of the AND-OR-INVERTER gate and the ground terminal, and the third NMOS has a gate terminal wired to the output terminal of the NOR gate.

18. The successive-approximation register analog-to-digital converter as claimed in claim 17, wherein:
the first NMOS has a drain terminal wired to the output terminal of the OR-AND-INVERTER gate, and the gate terminal of the first NMOS is wired to the positive output terminal of the comparator; and
the second NMOS has a drain terminal wired to a source terminal of the first NMOS, and a source terminal wired to the ground terminal, and the gate terminal of the second NMOS is wired to the window control signal.

19. The successive-approximation register analog-to-digital converter as claimed in claim 1, wherein:
the comparator is reset by a high-level signal;
the digital-to-analog converter's switching is reset by a high-level signal; and
each one-gate-delay circuit is an OR-AND-INVERTER gate.

20. The successive-approximation register analog-to-digital converter as claimed in claim 1, wherein:
the comparator is reset by a high-level signal;
the digital-to-analog converter's switching is reset by a low-level signal; and
each one-gate-delay circuit is an OR-AND-INVERTER gate.

21. The successive-approximation register analog-to-digital converter as claimed in claim 1, wherein:
the comparator is reset by a low-level signal;
the digital-to-analog converter's switching is reset by a high-level signal; and
each one-gate-delay circuit is an AND-OR-INVERTER gate.

22. The successive-approximation register analog-to-digital converter as claimed in claim 1, wherein:
the comparator is reset by a low-level signal;
the digital-to-analog converter's switching is reset by a low-level signal; and
each one-gate-delay circuit is an AND-OR-INVERTER gate.

* * * * *